United States Patent
Borkholder et al.

(10) Patent No.: US 12,419,194 B2
(45) Date of Patent: Sep. 16, 2025

(54) PULSE ENERGY MANIPULATION OF MATERIAL PROPERTIES

(71) Applicants: David A. Borkholder, Canandaigua, NY (US); Jing Ouyang, Scottsville, NY (US); Denis R. Cormier, Pittsford, NY (US); Ahmed Alfadhel, Rochester, NY (US)

(72) Inventors: David A. Borkholder, Canandaigua, NY (US); Jing Ouyang, Scottsville, NY (US); Denis R. Cormier, Pittsford, NY (US); Ahmed Alfadhel, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 18/144,469

(22) Filed: May 8, 2023

(65) Prior Publication Data

US 2023/0276709 A1 Aug. 31, 2023

Related U.S. Application Data

(62) Division of application No. 15/925,166, filed on Mar. 19, 2018, now abandoned.
(Continued)

(51) Int. Cl.
*H10N 30/045* (2023.01)
*B05D 3/00* (2006.01)
(Continued)

(52) U.S. Cl.
CPC ............ *H10N 30/045* (2023.02); *B05D 3/14* (2013.01); *B05D 3/207* (2013.01); *B05D 7/14* (2013.01);
(Continued)

(58) Field of Classification Search
CPC .. B05D 3/14; B05D 3/207; B05D 7/14; H01L 41/257; H01L 41/1876; H01L 41/43
See application file for complete search history.

(56) References Cited

U.S. PATENT DOCUMENTS

| 3,229,261 A | 1/1966 | Fatuzzo et al. |
| 3,648,119 A * | 3/1972 | Van Eeck ............ H10N 70/253 327/479 |

(Continued)

OTHER PUBLICATIONS

Ouyang, et al. "Photonic Sintering of Aerosol Jet Printed Lead Zirconate Titanate (PZT) Thick Films" Journal of the American Ceramic Society (2016).
(Continued)

*Primary Examiner* — Dah-Wei D. Yuan
*Assistant Examiner* — Kristen A Dagenais
(74) *Attorney, Agent, or Firm* — Bond Schoeneck & King, PLLC; Joseph M. Noto

(57) ABSTRACT

Material properties are manipulated using rapid pulse application of energy in combination with applied electric or magnetic fields. When sintering, annealing or crystallizing a target film, the pulse repetition cycle can be constrained to ensure material temperature rises above and falls below the Curie temperature before the next energy pulse. This process results in enhanced material properties as compared to traditional techniques having a single, slow temperature excursion and subsequent application of the applied external field.

13 Claims, 11 Drawing Sheets

Related U.S. Application Data

(60) Provisional application No. 62/473,039, filed on Mar. 17, 2017.

(51) Int. Cl.
  B05D 3/14 (2006.01)
  B05D 7/14 (2006.01)
  C01G 25/00 (2006.01)
  H10N 30/097 (2023.01)
  H10N 30/853 (2023.01)

(52) U.S. Cl.
  CPC ......... *C01G 25/006* (2013.01); *H10N 30/097* (2023.02); *H10N 30/8554* (2023.02)

(56) References Cited

U.S. PATENT DOCUMENTS

| | | |
|---|---|---|
| 3,950,659 A | 4/1976 | Dixon et al. |
| 4,089,034 A | 5/1978 | Taylor et al. |
| 4,185,322 A | 1/1980 | Schroder |
| 4,407,054 A | 10/1983 | Zipfel, Jr. |
| 4,731,754 A | 3/1988 | Ogden |
| 8,344,585 B2 | 1/2013 | Erbil et al. |
| 10,730,226 B2 | 8/2020 | Li |
| 2005/0181126 A1* | 8/2005 | Bergstrom ............. H05B 6/105 427/218 |
| 2011/0300490 A1 | 12/2011 | Rachet et al. |
| 2011/0316385 A1 | 12/2011 | Erbil et al. |
| 2015/0228371 A1* | 8/2015 | Kim ..................... H10K 30/821 264/105 |
| 2015/0240103 A1* | 8/2015 | Farnham ................ H05K 1/097 252/514 |
| 2017/0113297 A1* | 4/2017 | Davis ....................... C25D 5/56 |

OTHER PUBLICATIONS

Ouyang, et al. "Photonically Sintered PZT Energy Harvester", ASME 2015 IMECE (2015).

Webster's Ninth New Collegiate Dictionary; Merriam-Webster, Inc., publishers; Springfield, Massachusetts, USA; 1990 (no month), excerpt p. 87.

Webster's Ninth New Collegiate Dictionary; Merriam-Webster, Inc., publishers; Springfield, Massachusetts, USA; 1990 (no month), excerpt p. 444.

* cited by examiner

PULSE ENERGY MANIPULATION OF MATERIAL PROPERTIES

CROSS REFERENCE

This application is a divisional of U.S. patent application Ser. No. 15/925,166, filed Mar. 19, 2018, which claims the benefit of the filing date of U.S. Provisional Patent Application No. 62/473,039, filed Mar. 17, 2017, all which are hereby incorporated by reference in their entirety.

FIELD

The present invention relates to methods for pulse energy manipulation of material properties, and in particular to methods for pulse energy manipulation with simultaneous field application.

BACKGROUND

Ferroelectric film sintering and properties manipulation.

A conventionally used ferroelectric film sintering method includes thermal sintering with high temperature (>800° C.) and sufficient duration (>0.5 hr). The dipole reorientation step (poling) is carried out after sintering by applying sufficiently high electric field and long duration (>0.5 hr), often at elevated temperature. For most applications the poling temperature is kept below the Curie temperature, although in a few cases the temperature is driven to slightly above the Curie temperature and then slowly reduced to room temperature while maintaining the applied electric field.

Magnetic film sintering and properties manipulation.

Bulk magnetic materials are often thermally sintered to densify the material for enhanced properties. Thin films are generally sputtered and do not require this sintering step. However, they are often thermally annealed to enhance their properties.

Magnetizing a magnetic material requires applying strong homogeneous magnetic field along the required direction. For some applications, magnetic anisotropy is required which could be prepared by applying strong homogeneous magnetic field to reorient the magnetic dipoles while heating the sample to a temperature below the Curie temperature. The temperature changes are slow.

Nanocomposite film sintering and electric/magnetic properties tuning.

High temperature sintering is required to densify the film, generally carried out in a furnace. Poling and magnetizing are used to manipulate the dipole orientation to enhance the ferroelectric and magnetic properties. However, the sintering, poling, and magnetizing are separately performed and utilize slow ramp temperature increases and decreases.

Sintering (or annealing) and dipole reorientation are two key steps of the conventional fabrication of ferroelectric and magnetic film devices to enhance or tune the ferroelectric or magnetic properties. According to conventional processes, these two steps are separately processed, which requires long process duration and increases the complexity.

Sintering requires temperatures well above the Curie temperature. Magnetic dipole re-orientation is generally done around the Curie temperature while ferroelectric dipole re-orientation is done below the Curie temperature. For all these materials, taking the material above the Curie temperature results in loss of the electric or magnetic anisotropy induced by processing under the applied electric or magnetic field. There have been no reports of simultaneous sintering and poling/magnetization due to this temperature mismatch. Transients to well above the Curie temperature during poling/magnetization have not been reported due to this temperature mismatch.

All processes are single, slow temperature cycle. There are no reports of processing with pulsed energy of the timeframes of this invention. Nor are there reports of repeated temperature excursions as part of the processing.

SUMMARY

In accordance with one aspect of the present invention, there is provided a process for manipulating material properties of a target film, including applying repeated pulsed energy, including a total energy, cycle time, duration, and time between each pulse, while simultaneously applying an electric field or a magnetic field to the target film facilitating dipole reorientation resulting in enhanced material properties of the target film.

In accordance with another aspect of the present invention, there is provided a process for manipulating material properties of a target film, including applying repeated pulsed energy at a total energy, cycle time, duration, and time between each pulse sufficient to sinter, anneal or crystallize the target film in combination with applying repeated pulsed energy while simultaneously applying an electric field or a magnetic field to the target film facilitating dipole reorientation of the target film.

These and other aspects of the present disclosure will become apparent upon a review of the following detailed description and the claims appended thereto.

DETAILED DESCRIPTION

Figure 1:
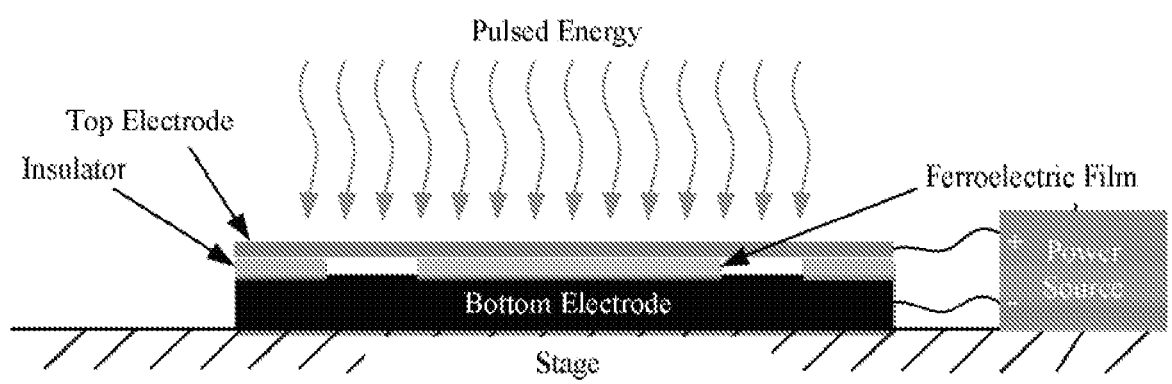
FIG. 1 is a schematic showing a setup for pulsed energy processing the ferroelectric film with poling or simultaneous sintering plus poling.

Sintering, annealing or crystallization and dipole reorientation are two important concepts in the fabrication of ferroelectric and magnetic film devices in accordance with the present invention to enhance or tune the ferroelectric or magnetic properties of the film. Poling or simultaneous sintering/annealing/crystallizing and poling can be accomplished by rapid pulsed energy. Rapid pulsed energy includes total energy, cycle time, duration, and time between each pulse. In contrast, traditional sintering, annealing, and crystallization methods raise the temperature of the film plus substrate to a target temperature for an extended period of time (30 minutes to many hours), with a slow return to room temperature and is done prior to poling.

In accordance with an embodiment of the present invention poling involves applying repeated pulsed energy while simultaneously applying an external field to the target film facilitating dipole reorientation resulting in enhanced material properties of the target film. For ferroelectric target materials this external field is an electric field. For magnetic target materials the applied external field is a magnetic field. In an embodiment, poling of the target film includes driving the temperature of the target film above the Curie temperature, with cooling to below the Curie temperature. In an embodiment, poling of the target film includes the temperature of the target film remaining below the Curie temperature throughout the pulsing cycle.

In an embodiment of the present invention, poling is achieved with application of the external field in combination with repetitive application of applied pulsed energy to drive the temperature well above the Curie temperature, with cooling to well below the Curie temperature. The temperature transients and temperature profile through the thickness of the film is defined by the characteristics of the pulse profile. For example, the power delivered in each pulse determines the temperature rise with the first pulse, while the time between pulses limits the minimum temperature reached by the film before the next pulse. Hence, the combination of pulse power, time between pulses, and total number of pulses defines the maximal temperature achieved in the film. The duration of each pulse impacts the temperature transient experienced with each pulse, with longer pulses resulting in larger temperature transients. Accordingly, the film can be sintered, annealed, or crystalized simultaneously with poling, with the repetitive pulses providing the required energy for the thermal process.

In an embodiment, a process for manipulating material properties of a target film, includes applying repeated pulsed energy, including a total energy, cycle time, duration, and time between each pulse, while simultaneously applying an electric field or a magnetic field to the target film facilitating dipole reorientation resulting in enhanced material properties of the target film. In an embodiment, the target film is further simultaneously sintered, annealed or crystallized prior to or during poling by applying the repeated pulsed energy at a total energy, cycle time, duration, and time between each pulse sufficient to increase the temperature of the target film above the Curie temperature followed by cooling of the temperature of the target film to a temperature below the Curie temperature before the next energy pulse. In an embodiment, the target film is further simultaneously crystallized by applying the repeated pulsed energy at a total energy, cycle time, duration, and time between each pulse wherein the temperature of the target film remains below the Curie temperature.

In an embodiment, a process for manipulating or enhancing material properties of a target film, includes applying a pulsed energy to a target film to increase the temperature of the target film above the Curie temperature followed by cooling of the temperature of the target film to a temperature below the Curie temperature before the next energy pulse, so as to sinter, anneal or crystallize the target film; and simultaneously applying an electric field or a magnetic field to the target film, wherein the pulsed energy includes a total energy and pulse profile to facilitate dipole reorientation during sintering, annealing or crystallizing of the target film resulting in enhanced material properties.

In an embodiment, the target film is a ferroelectric material wherein an electric field is simultaneously applied resulting in electric dipole reorientation and enhanced material properties including piezoelectric properties and sensitivity.

In an embodiment, the target film is a magnetic material wherein a magnetic field is simultaneously applied resulting in magnetic dipole reorientation and enhanced material properties including magnetic properties.

In an embodiment, the target film can be sintered, crystallized, or annealed prior to or during poling.

Pulsed energy application creates rapid temperature transients that are constrained to the target film. The rapid temperature changes which can be controlled to accomplish temperature excursions to above and below the Curie temperature as desired create opportunities for enhanced material properties as compared to slow, single transient processing. Repetitive pulsing creates additional opportunities for material property control.

Photonic sintering was developed originally to rapidly sinter nanoparticle-based films. For example, a flash lamp on the ceiling of the tool generates broadband, sub-millisecond high intensity pulses that controllably heat to sinter the target film. The present invention adopts the photonic sintering method on ferroelectric material. This creates the opportunity of processing the dipoles reorientation simultaneously with photonic sintering. This invention simplifies the ferroelectric, magnetic, and magnetoelectric nanocomposites film fabrication process, shortens the processing duration, and enables processing of the film directly on a low melting point substrate.

While a photonic flash lamp is described as one potential pulsed energy source, suitable alternative methods can be utilized that result in rapid temperature transients within the target film, which methods include, for example, electric current induced resistive heating, laser illumination, radiation, UV illumination, and AC magnetic field application.

Material properties are manipulated using rapid pulse application of energy, independently or in combination with applied electric or magnetic fields. In an embodiment, the pulse repetition cycle is constrained to ensure material temperature rises above and falls below the Curie temperature before the next energy pulse. This process results in enhanced material properties as compared to traditional techniques having a single, slow temperature excursion and subsequent application of the applied external field.

Two specific examples are described for ferroelectric and magnetic materials, using a high energy photonic flash as the energy pulse. Although other sources of energy that are capable of providing the rapid, pulsed temperature transients could also be used.

In an embodiment regarding ferroelectric materials, a process to manipulate or enhance the electrical properties of ferroelectric films, includes poling a ferroelectric material film using a bottom electrode and top transparent electrode to provide the external electric field via an applied voltage wherein energy from a photonic flash lamp is absorbed by the film, resulting in rapid temperature increases to above the Curie temperature, followed by rapid temperature decay to well below the Curie temperature; repetitive pulsing of the photonic lamp to provide the appropriate total energy and pulse profile to facilitate the dipole reorientation and enhance the resulting piezoelectric properties for enhanced material properties of the ferroelectric material film; and simultaneously sintering the ferroelectric material film photonically.

In contrast to the present invention, conventional sintering followed by poling are two necessary steps to manipulate or enhance the electrical properties of ferroelectric films. Lead zirconate titanate (PZT) is an example ferroelectric material that is conventionally sintered using a thermal process at temperatures well above the Curie temperature (e.g. >800° C.), with hold times in excess of 30 minutes. Following sintering, there is a dipole reorientation step (poling) where an external electric field is applied for greater than 30 minutes. This poling step is often performed at elevated temperatures below the Curie temperature to facilitate the dipole reorientation and enhance the resulting piezoelectric properties.

This conventional process is improved by an embodiment of the method of the present invention with energy from the photonic flash lamp replacing traditional thermal (e.g., oven) processes. Sintering can be done as a separate step thermally or photonically, with subsequent poling during photonic pulsed energy with the PZT film under an applied electric field. Or the processes can be combined with simultaneous photonic sintering and poling. FIG. 1 is an example system setup for this process, showing a bottom electrode and top transparent electrode to provide the external electric field via an applied voltage. The electrode separation is carefully controlled by the insulator film thickness to define the resulting electric field. Photonic energy is transferred to the ferroelectric material through the upper transparent electrode (e.g., ITO coated glass). This energy is absorbed by the PZT film, resulting in rapid temperature increases to above the Curie temperature, followed by rapid temperature decay to well below the Curie temperature. Repetitive pulses of the photonic lamp can be used to provide the appropriate total energy and pulse profile for enhanced material properties as compared to conventional single cycle, slow temperature change methods.

FIG. 1 shows a setup for pulsed energy processing the ferroelectric film with poling or simultaneous sintering plus poling. The sample is sandwiched between top and bottom electrodes. Photonic flashes are transferred through the transparent top electrode to create a rapid temperature transient in the film. Simultaneously, the electric field is continuously applied to the sample to reorient the electric dipoles in the ferroelectric film.

Figure 2A:
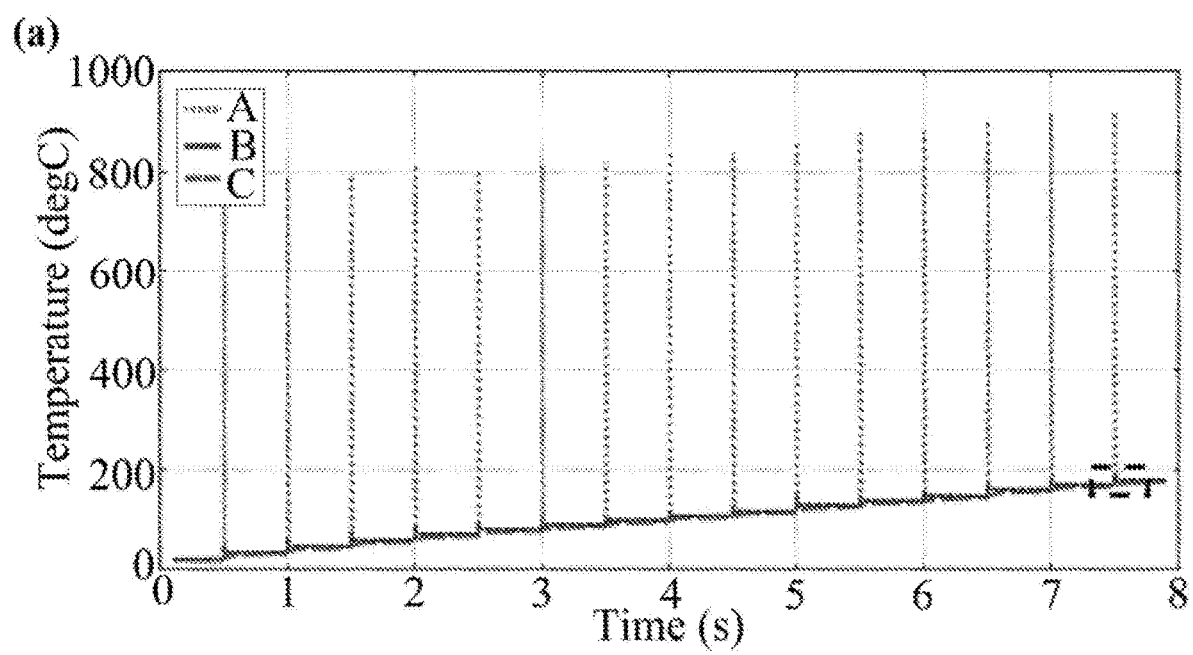
FIGS. 2A and 2B are published graphs showing a simulation of temperature profile with repetitive photonic pulses.
Figure 2B:
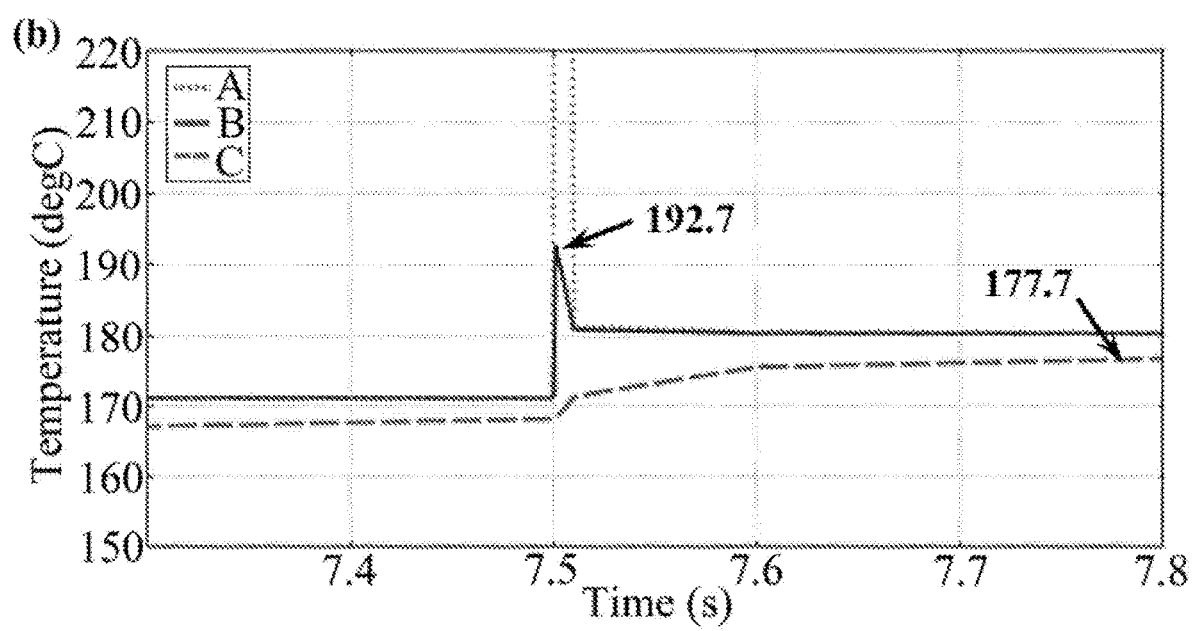

FIG. 2 shows a simulation of temperature profile with repetitive photonic pulses from [Ouyang, et al., 2016].

In an embodiment regarding magnetic materials a process for thermal annealing of ferromagnetic and antiferromagnetic materials, includes applying a pulsed, photonic energy to a magnetic film, resulting in rapid temperature increase to above the Curie temperature, followed by rapid temperature decay to well below the Curie temperature; magnetizing or reorienting magnetic dipoles of the magnetic film with simultaneous application of an external magnetic field, wherein repetitive pulses of the photonic lamp can be used to provide the appropriate total energy and pulse profile for enhanced material properties of the magnetic film; and sintering the magnetic material, if required, optionally simultaneously.

Thermal annealing of materials involves raising the material temperature to allow atoms to diffuse to an equilibrium state. For ferromagnetic and antiferromagnetic materials, thermal annealing is often done with an externally applied magnetic field to reorient the magnetic dipoles. The result is control of the intrinsic properties of the magnetic material. For example, ferromagnetic materials have a naturally formed easy axis due to the lattice structure, material's shape, and internal strain. Magnetic annealing can overcome this natural anisotropy and lead to an anisotropy direction and easy axis along the direction of the applied magnetic field. When a ferromagnetic lattice is annealed at a high temperature, the spins of each individual atom will align with the applied magnetic field. The spin-field interaction at high temperature will begin to reorganize the lattice until reaching equilibrium with respect to the applied afield. When the material cools down, the lattice becomes locked, retaining the redefined anisotropy direction.

Traditional magnetic thermal annealing is conventionally conducted in a vacuum furnace with a magnetic field source (e.g., customized high temperature magnets or an electromagnet). This process is conducted over a long period of time; mainly to allow the heating and cooling process. This conventional annealing process requires using substrate materials that can withstand the extremely high temperature. This limitation prevents processing magnetic films deposited on low melting-point (relative to the film) substrate materials, which is important for many applications related to flexible and wearable electronics.

Figure 3:
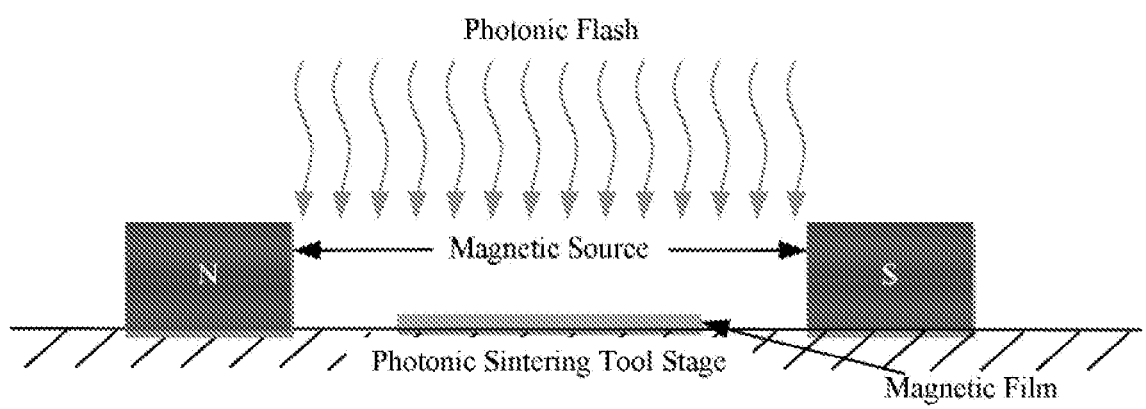
FIG. 3 is a schematic showing a setup used to magnetize a thin-film, or reorient magnetic dipoles during pulsed energy processing.

The thermal annealing process is accomplished with the present invention with energy from the photonic flash lamp replacing traditional thermal (e.g., vacuum oven) processes. The process of magnetizing or reorienting magnetic dipoles of magnetic films is done with simultaneous application of an external magnetic field as shown in FIG. 3. Pulsed, photonic energy is absorbed by the magnetic film, resulting in rapid temperature increase to well above the Curie temperature, followed by rapid temperature decay to well below the Curie temperature. Repetitive pulses of the photonic lamp can be used to provide the appropriate total energy and pulse profile for enhanced material properties as compared to conventional single cycle, slow temperature change methods. As described for the ferroelectric materials, sintering may be simultaneously accomplished for the magnetic material if required.

FIG. 3 shows a process setup used to magnetize a thin-film, or reorient magnetic dipoles during pulsed energy processing. The magnetic film is placed in an ideally homogeneous magnetic field and directly exposed to the photonic flashes.

A specific example of the invention can be demonstrated by magnetizing an ink-jet printed ferromagnetic (e.g., nickel) film during photonic sintering. A C-shaped permanent magnet can be used to provide the homogenous magnetic field source. The film is placed between the magnet poles, and directly exposed to the flashes. Therefore, the nickel film can be sintered and magnetized at the same time, although these two processes can also be done sequentially. During periods when the film temperature is elevated, magnetic dipoles are reoriented toward the applied magnetic field inducing magnetic anisotropy.

Another application of the invention allows controlling the magnetic properties of ferrites by controlling the sintering temperature to change the state of the magnetic material from antiferromagnetic to paramagnetic, for example.

In read head and magnetic sensing applications (e.g., spin-valves and magnetoresistive sensors) multiple, nm thickness stacked films are required. These stacks often include metal oxide films that are prone to further oxidation and undesired film thickness growth during high temperature annealing. The pulsed energy approach of the present invention can accurately control both temperature increase and temperature profile over time to limit undesired changes in the film stack, while enabling desired modulation of film properties. Obtaining large exchange bias field and high magnetoresistance values are the key enhancements needed by the pulsed energy with the presence of magnetic field. Moreover, controlling undesired oxidation and crystallographic mis-orientation can limit the increase in coercivity, which degrades the device performance. The rapid temperature transients enabled by the present invention also limit undesired inter-layer diffusion as compared to conventional methods.

Figure 4:
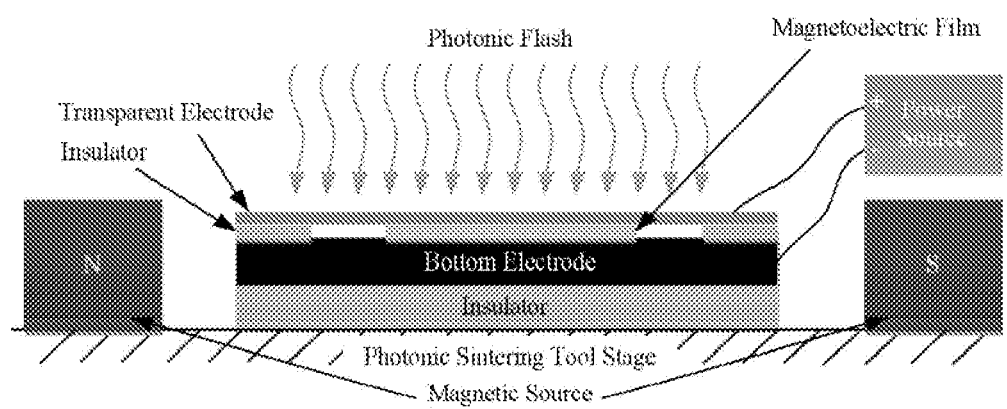
FIG. 4 is a schematic showing a setup for pulsed energy processing the magnetoelectric film.

The method of the present invention is useful for tuning electric and magnetic properties. Electrical and magnetic tuning is important for nanocomposite materials such as magnetoelectric nanocomposites that are made of ferroelectric material with embedded magnetic nanowires or nanoparticles. The magnetoelectric nanocomposite film requires both ferroelectric poling and magnetic materials tuning. The setup of this process is shown in FIG. 4, which combines elements of FIGS. 1 and 3. FIG. 4 illustrates a setup for pulsed energy processing the magnetoelectric film. The sample is sandwiched between top and bottom electrodes to apply an electric field during processing. A magnetic field source re-orients magnetic dipoles or induces magnetization during processing. Photonic flashes are transferred through the transparent top electrode to create a rapid temperature transient in the film. The film is sandwiched between a bottom electrode and a top transparent electrode to provide the external electric field via an applied voltage. The electrode separation is carefully controlled by the insulator film thickness to define the resulting electric field. An external magnetic field is applied (preferably homogeneous) to the magnetoeletric film. Photonic energy is transferred to the magnetoelectric material through the upper transparent electrode (e.g., ITO coated glass). This energy is absorbed by the film, resulting in rapid temperature increases to above the Curie temperature, followed by rapid temperature decay to well below the Curie temperature. Repetitive pulses of the photonic lamp can be used to provide the appropriate total energy and pulse profile for enhanced material properties as compared to conventional single cycle, slow temperature change methods. As described for the ferroelectric materials, sintering may be simultaneously accomplished for the magnetoelectric material if required.

An embodiment of the invention is demonstrated by poling and magnetizing an ink-jet printed film of PZT with embedded nickel nanoparticles during photonic sintering (or following photonic or traditional sintering), as shown in FIG. 4. This film is printed on a stainless steel substrate to serve as a bottom electrode. An ITO glass slide serves as the top electrode with ITO side facing down, separated from the bottom electrode by electrically insulating double-sided tape of known thickness. A glass slide is placed under the bottom electrode to separate bottom electrode and the photonic sintering tool stage. A C-shaped permanent magnet is served as the magnetic field source. An external voltage source is applied between the top and bottom electrodes to create an electric field across the magnetoelectric film. Rapid pulsed energy from photonic flashes is absorbed by the film, causing rapid temperature increase, followed by rapid temperature decline to below the Curie temperature. The electric field orients the PZT dipoles while the magnetic field magnetizes the nickel nanoparticles.

While externally applied magnetic and electric fields are described, it is within the scope of the invention that these may be generated by structures integrated into the substrate, on top of the film, or in-plane with the film (e.g., interdigitated electrodes for in-plane electric fields, micro-scale permanent magnets on the substrate, etc.).

Application of the present invention to ferroelectric properties manipulation with pulsed energy processing is useful in the production of flexible PZT film energy harvesters. This type of energy harvester generates high power due to the high flexibility. It accordingly can be used for powering low power required systems, like micro-biomedical systems.

For other potential uses, this process is applicable to the production of most sintering and dipole reorientation required ferroelectric films, such as $BaTiO_3$, $PbTiO_3$, poly (vinylidene) fluoride (PVDF), for different applications, including ferroelectric actuators, pressure sensors, accelerometers.

Application of the present invention to magnetic properties manipulation with pulsed energy processing includes the production and magnetization of rare earth permanent magnets, which are fabricated by compressing ferromagnetic particles in a mold and in the presence of pulsed energy flashes and magnetic field to form a high density magnet and to magnetize the magnet, respectively. Ferromagnetic thin-film sensors can be fabricated with tuned magnetic properties by re-orienting the magnetic dipoles and inducing magnetic anisotropy. Fast magnetic field annealing for magnetic dipoles reorientation using the applied magnetic field and the heat generated by the flash photonic pulses can generate heat typically within the magnetic film only. The ability to use low melting-point (relative to the film) substrates (e.g., organic flexible substrates) due to the confinement of the pulsed-generated heat within the magnetic film without significantly heating the substrate, cannot be done with conventional annealing processes. Reducing the probability of annealing-induced interlayer diffusion in a multilayer materials stack is an important issue for many applications, such as spin-valves. The production of wide range of magnetic films (e.g., ferromagnetic and multiferroics) that require sintering and magnetic properties tuning are enabled, especially printed films, for different applications, such as magnetic sensors, data storage devices, and magnetic actuators.

Application of the present invention to tuning electric and magnetic properties with pulsed energy harvesting includes the production of magnetoelectric flexible energy harvesters. This type of energy harvester is able to scavenge electric power from both mechanical stress and magnetic wave. Due to its flexibility, it accordingly can be used for powering low energy required implantable or wearable systems.

This invention is applicable to the production of most sintering and dipoles reorientation required magnetoelectric nanocomposites films, to realize the applications such as computer memories, smart sensors, and actuators. The method can simultaneously sinter, pole, anneal and magnetize materials that require densifying and dipole reorientation, e.g., magnetoelectric and multiferroic materials, which increases efficiency and reduces processing time. This is not possible by any conventional annealing technology. The method provides the ability to combine magnetic field annealing with electric field and ultraviolet illumination to enhance the properties of the material.

Key differences from and advantages over the prior technology include, instead of separating sintering and dipole reorientation steps, this invention processes these two steps simultaneously. The resulting advantages are that the invention dramatically shortens the processing duration, is simple—does not require a complex setup, can directly process ferroelectric, magnetic and magnetoelectric films on a low melting point substrate, and single rapid pulse or repetitive pulses offer superior electric and magnetic properties over conventional approaches.

The invention processes the dipoles reorientation simultaneously during the sintering process. It simplifies the fabrication process of ferroelectric, magnetic, and magnetoelectric films on low melting point substrate. Applicable to most sintering and dipole reorientation required ferroelectric, magnetic, and magnetoelectric materials. Rapid pulsed energy driving a significant temperature excursion in the target film (which can be above or below the Curie temperature), with rapid decay to well below the Curie temperature. The temperature rise can be adjusted by controlling the pulse energy. Other advantages include repetitive pulse processing, batch process compatible, and cost effective.

The present methods can be used in the ferroelectric, magnetic, and magnetoelectric film device fabrication, especially the ones on the low melting temperature substrate. For different materials and substrates, the sintering parameters can be adjusted as desired.

The invention will be further illustrated with reference to the following specific examples. It is understood that these examples are given by way of illustration and are not meant to limit the disclosure or the claims to follow.

Example 1 demonstrates poling the aerosol-jet printed powder-based Lead Zirconate Titanate (PZT) film during short pulsed photonic sintering. A 20 μm thick PZT film is aerosol jet printed on a stainless steel substrate, which serves as the bottom electrode for the poling step. Prior to sintering, the printed film is dried on the hotplate at 200° C. for 2 hours to remove the solvent. An Indium Tin Oxide (ITO) glass slide serves as the top electrode with ITO layer facing down. Double sided tape (thickness=60 μm) is used to separate the top and bottom electrodes. A glass slide (thickness=1 mm) is placed between the bottom electrode and photonic sintering tool stage to avoid electrical shorting. During photonic sintering, an electric field (20 kV/cm) is applied from the voltage supply (power source) through the top and bottom electrodes to the PZT film to reorient the electric dipoles. The photonic sintering system is controlled by four parameters: applied voltage (250 V), pulse duration (1.3 ms), pulse frequency (2 Hz) and number of pulses (N=15). This parameter combination results in an energy density of 2848 mJ/cm$^2$ on the target PZT film for each pulse. These parameters result in temperature transients in the film shown in FIG. 2. After photonic sintering, the electric field is not removed until the temperature of the film is reduced to room temperature.

Figure 5:
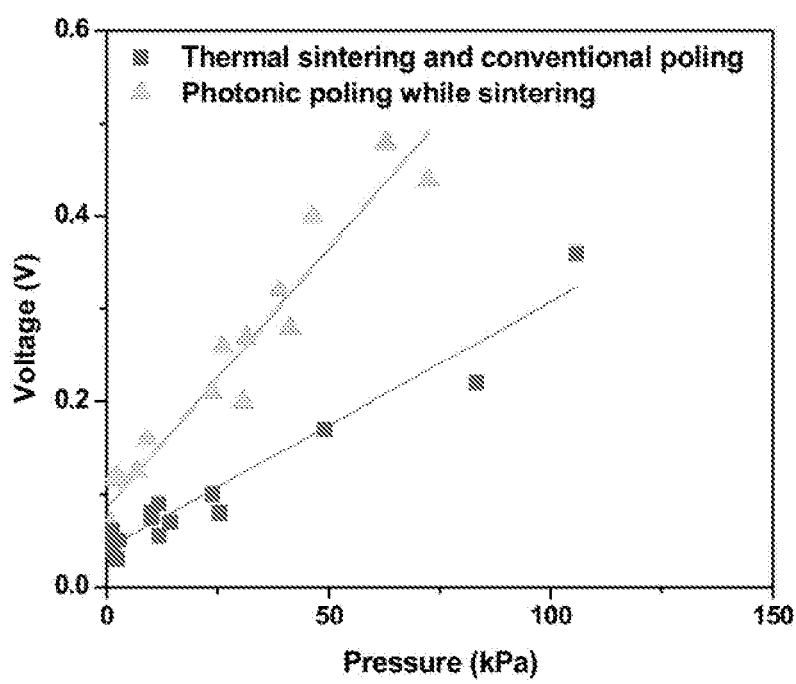
FIG. 5 is a graph showing superior piezoelectric performance of films processed in accordance with the present invention as compared to traditionally processed films (slow thermal sintering, slow thermal poling)

Example 2 demonstrates an aerosol-jet printed powder-based Lead Zirconate Titanate (PZT) with simultaneous sintering and poling during repetitive pulsed energy processing. The photonic flash lamp tool provided the pulsed energy in a setup shown in FIG. 1. This process resulted in superior piezoelectric performance as compared to traditionally processed films (slow thermal sintering, slow thermal poling) as shown in the FIG. 5 (lines represent linear fitting). Greater pressure sensitivity in the photonically poled while sintered PZT film indicates superior piezoelectric properties.

Example 3—Sub-Second Low Temperature Processing of PZT Films

This example demonstrates poling of the aerosol jet printed powder-based Lead Zirconate Titanate (PZT) film during short pulsed photonic sintering with the setup as shown in FIG. 1. The processed PZT was named SLP-PZT to stand for Sub-second Low temperature Processed PZT. A 5 μm thick PZT film is aerosol jet printed on a stainless steel substrate, which serves as the bottom electrode for the poling step. Prior to sintering, the printed film is dried on the hotplate at 200° C. for 1 hour in atmospheric conditions to remove the solvent. An Indium Tin Oxide (ITO) glass slide serves as the top electrode with the ITO layer facing down. Double sided tape (thickness=60 μm) is used to separate the top and bottom electrodes. A glass slide (thickness=1 mm) is placed between the bottom electrode and photonic sintering tool stage to avoid electrical shorting. During photonic sintering, an electric field (20 kV/cm) is applied from the power source through the top and bottom electrodes to the PZT film to reorient the electric dipoles. The photonic sintering system is controlled by five parameters: applied voltage (600 V), pulse duration (130 μs), pulse frequency (2 Hz), number of pulses (N=23), and number of cycles (C=2). This parameter combination results in an energy density of 2.75 J/cm$^2$ emitted from the bulb for each pulse. However, due to the energy absorption of top ITO glass, the effective energy density transferred to the PZT film is lowered to 1.90 J/cm$^2$. The energy density is measured using a bolometer (Novacentrix Corporation, Austin, TX). After photonic sintering, the electric field is not removed until the temperature of the film is reduced to room temperature.

Commercially available nano-scaled (average diameter=480 nm) Lead Zirconate Titanate (PZT) particles (LQ-S1-SL-P, Choko Co., Ltd., Japan) were mixed with DI water. Polyvinylpyrrolidone (PVP) (Sigma-Aldrich Co. LLC, St. Louis, MO) was added to promote the adhesion of printed PZT to the substrate following drying and to serve as the dispersant. $Cu_2O$ (Sigma-Aldrich Co. LLC, St. Louis, MO) and PbO (Sigma-Aldrich Co. LLC, St. Louis, MO) powders (molecular weight ratio=1:4) were added to serve as the liquid phase sintering aid [1] to lower the PZT film required sintering temperature. The mixing process was carried out using a homogenizer (PRO 250, PRO Scientific Inc., Oxford, CT) for 5 min at 26000 rpm. The ink composition is shown in the Table 1.

TABLE 1

| PZT Ink Composition | |
| --- | --- |
| Material | Wt. % |
| PZT | 30 |
| DI Water | 65.4 |
| PVP | 3 |
| PbO | 1.38 |
| $Cu_2O$ | 0.22 |

Aerosol jet printing technique was used to form the PZT thick films (7×7 mm$^2$) on the stainless steel substrate. After drying the film at 200° C. in the atmospheric condition for 1 hour, as thin as 5 μm thickness (FIG. 6) was achieved by using the optimized printing combination (atomization=780 SCCM, VI=740 SCCM, Sheath Gas=35 SCCM, Printing Speed=16 mm/s).

Figure 6:
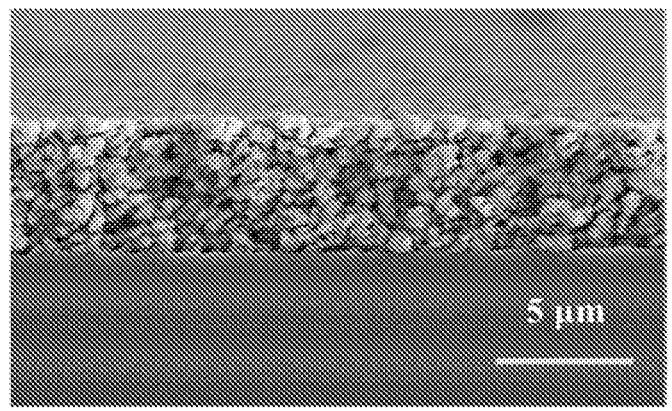
FIG. 6 is a SEM of a 5 μm PZT film formed using aerosol jet printing technique prior to sintering.

FIG. 6 shows a 5 μm PZT film formed using aerosol-jet printing technique prior to sintering.

Figure 7:
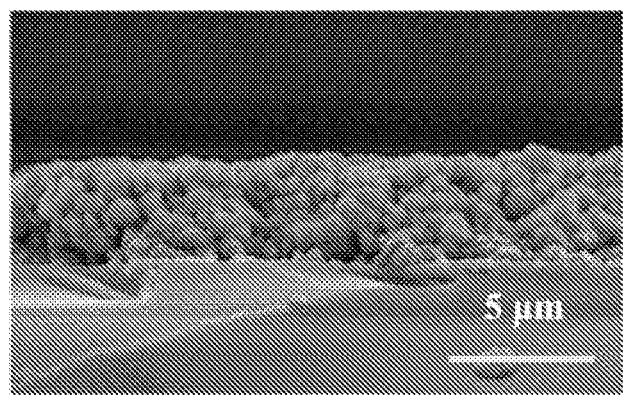
FIG. 7 is a SEM of a fully photonically sintered PZT film.

An optimized sintering parameter combination (Voltage=600 V; Pulse Duration=130 μs; Frequency=2 Hz; Number of Pulses=23; Number of Cycles=2) was used to obtain a fully photonically sintered PZT film while avoiding burning of the ITO layer (and associated loss of conductivity). The fully sintered PZT thick film is shown in FIG. 7. Notice the particles size was increased after sintering due to the particles expanding and merging.

Six groups of sample were prepared for piezoelectric property comparison (TS represents thermally sintered; PS represents photonically sintered; CP represents conventionally poled; PP represents poling while photonic sintering; L represents 1 hour poling duration; S represents 5 minutes poling duration which is equal to the total time-scale used for processing a SLP-PZT, inclusive of cool-down time).

The first group was thermally sintered at 1000° C. for 1 hour in the $N_2$ environment. After overnight resting at room temperature to relieve the stress, the films were coated with a layer of silver epoxy (EJ2189, Epoxy Technology, Inc, Billerica, MA) that served as the top electrode (5×5 mm$^2$). Then the films were poled at a temperature of 170° C. for 1 hour with an electric field of 20 kV/cm (TS-CP-L).

The second group was sintered thermally at 1000° C. for 1 hour in the $N_2$ environment. After overnight resting at room temperature to relieve the stress, the films were coated a layer of silver epoxy served as the top electrode (5×5 mm$^2$). Then the films were poled at a temperature of 170° C. for 5 minutes with an electric field of 20 kV/cm (TS-CP-S).

The third group was sintered photonically (without ITO glass on top) at the sintering condition: Voltage=400 V; Pulse Duration=650 μs; Frequency=2 Hz; Number of Pulses=20; Number of Cycles=2. This parameter combination results in an energy density of 5.06 J/cm$^2$ on the target PZT film, which gave a better sintering quality. After overnight resting at room temperature to relieve the stress, the films were coated a layer of silver epoxy that served as the top electrode (5×5 mm$^2$). Then the films were poled at a temperature of 170° C. for 1 hour with an electric field of 20 kV/cm (PS-CP-L).

The forth group was sintered photonically (without ITO glass on top) at the sintering condition: Voltage=400 V; Pulse Duration=650 μs; Frequency=2 Hz; Number of Pulses=20; Number of Cycles=2. After overnight resting at room temperature to relieve the stress, the films were coated a layer of silver epoxy served as the top electrode (5×5 mm$^2$). Then the films were poled at a temperature of 170° C. for 5 minutes with an electric field of 20 kV/cm (PS-CP-S).

The fifth group was SLP-PZT group. An electric filed (20 kV/cm) was applied from the power source through the top (ITO glass with ITO layer facing down) and bottom (stainless steel substrate) electrodes to the PZT film to reorient the electric dipoles. The photonic sintering system was controlled by five parameters: applied voltage (600 V), pulse duration (130 μs), pulse frequency (2 Hz), number of pulses (N=23), and number of cycles (C=2). After photonic sintering, the electric field was not removed until the temperature of the film was reduced to room temperature. The entire process took 5 minutes. The films were then coated with a layer of silver epoxy that served as the top electrode for electrical characterization (PS-PP-S).

The sixth group was prepared to investigate whether the piezoelectric property of SLP-PZT can be further enhanced. The SLP-PZT samples were further poled at a temperature of 170 t for 1 hour with an electric field of 20 kV/cm (PS-PP-CP-L).

Figure 8A:
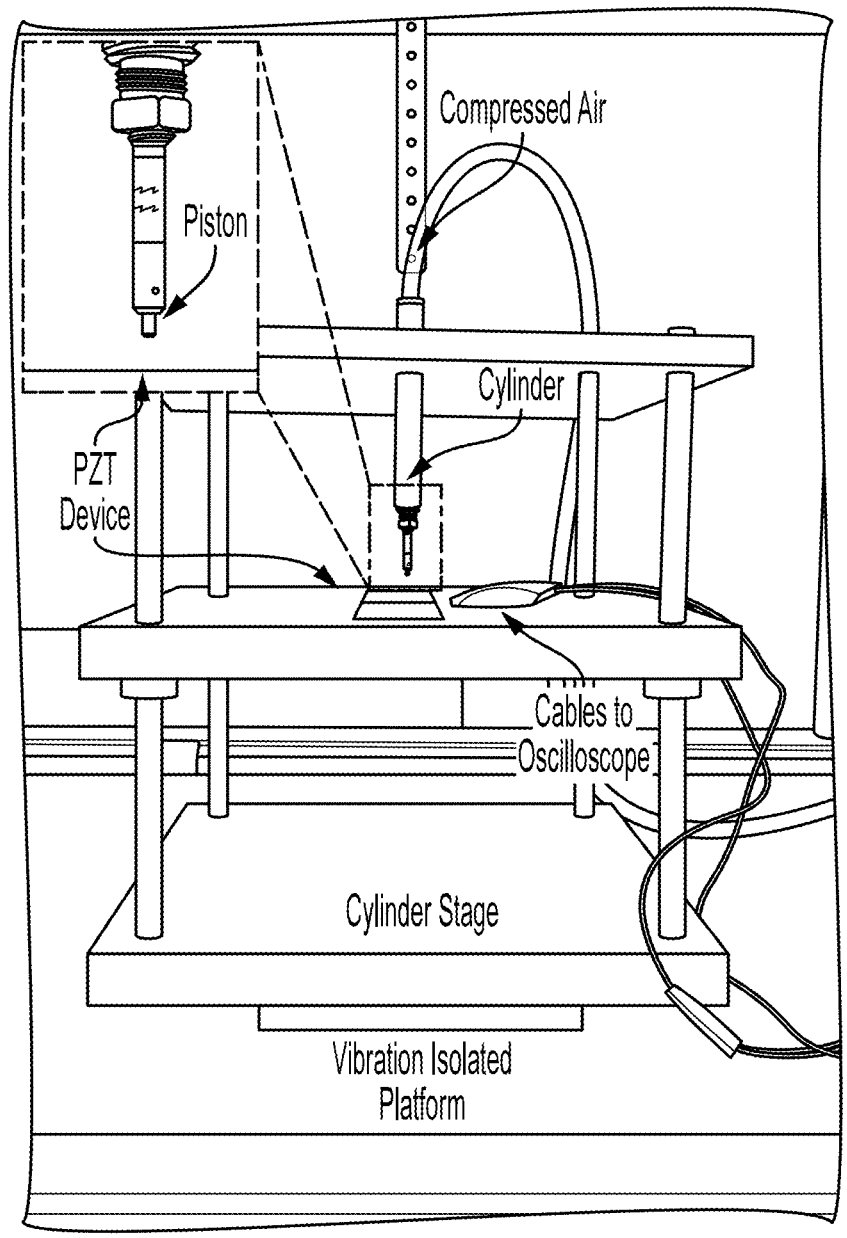
FIG. 8A is a picture of a piezoelecric characterization setup.
Figure 8B:
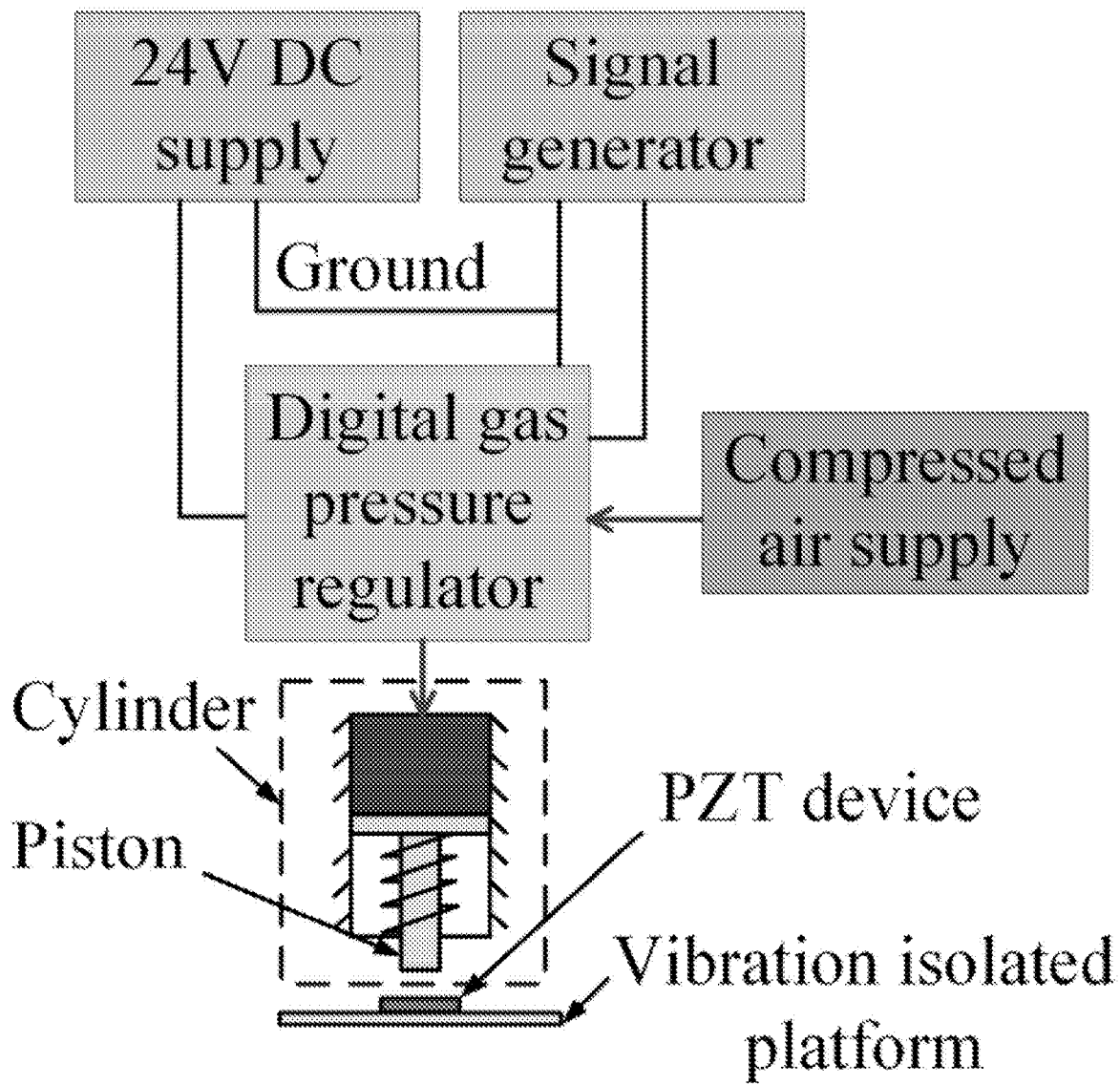
FIG. 8B is a schematic of the cylinder system for piezoelectric voltage coefficient ($g_{33}$) measurement shown in FIG. 8A

The sintered PZT film piezoelectric voltage coefficient ($g_{33}$) and relative permittivity ($\varepsilon_r$) were measured using a self-build cylinder system (FIGS. 8A and 8B and an RC bridge circuit (FIG. 8C), respectively, after setting the samples aside at room temperature overnight to relieve the stress induced during poling process. The measurement process has been described publication [2]. The piezoelectric charge coefficient ($d_{33}$) was calculated using Equation 1.

$$d_{33} = G_{33}\varepsilon_r\varepsilon_0$$

where $\varepsilon_0$ is the electric constant ($\varepsilon_0 \approx 8.854 \times 10^{-12}$ F/m).

Figure 8C:
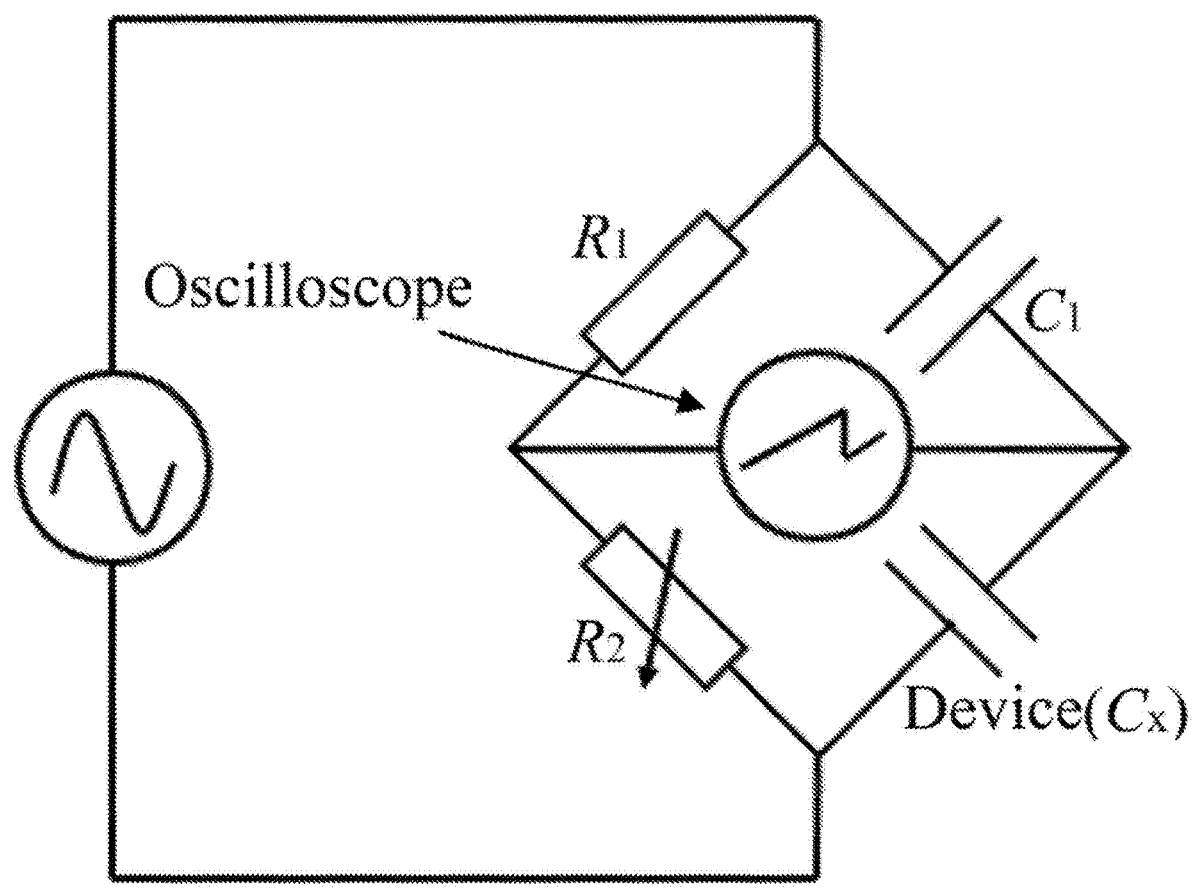
FIG. 8C is a schematic of an RC bridge circuit diagram for PZT film capacitance measurement.

FIGS. 8A, 8B and 8C show the piezoelecric characterization setups. The picture FIG. 8A and schematic FIG. 8B show a self-built cylinder system for piezoelectric voltage coefficient ($g_{33}$) measurement. FIG. 8C shows RC bridge circuit diagram for PZT film capacitance measurement. The bridge can be balanced by adjusting the resistance of $R_2$. The capacitance of the PZT device ($C_x$) is equal to the ratio $R_1 \times C_1$ to $R_2$. And the $\varepsilon_r$ can be obtained by the equation: $\varepsilon_r = C_x t/(\varepsilon_0 A)$, where t is the PZT film thickness, A is the area of overlap of the top and bottom electrodes (25 mm$^2$ for this experiment).

The results are summarized in the Table 2. It is noted that each result is averaged from 5 samples' experimental results. By comparing all six groups, the SLP-PZT yields the best piezoelectric property. Moreover, this piezoelectric property cannot be further enhanced using conventional poling approach. Notice, the conventionally poled samples at the SLP-PZT time-scale show very weak piezoelectric property indicating, in such a short duration, it is not possible to obtain a high piezoelectric property using conventional poling approach. For the given poling duration, photonically sintered samples show superior piezoelectric property than thermally sintered samples due to the lower secondary phase (known as pyrochlore phase because of the lead loss at high sintering temperature) obtained in the photonically sintered PZT films as described in publication [2].

TABLE 2

The piezoelectric property of six sample groups

| Methods | $g_{33}$ ($10^{-3}$ V-m/N) | $d_{33}$ ($10^{-12}$ m/V) |
|---|---|---|
| TS-CP-S | 6.6 | 21.6 |
| TS-CP-L | 21.3 | 341.2 |
| PS-CP-S | 8.0 | 26.4 |
| PS-CP-L | 22.1 | 516.3 |
| PS-PP-S (i.e. SLP-PZT) | 22.6 | 626.0 |
| PS-PP-CP-L | 22.5 | 597.2 |

[1] Corker, D. L., Whatmore, R. W., Ringgaard, & Wolny, W. W. (2000). Liquid-phase sintering of PZT ceramics. *Journal of the European Ceramic Society*, 20(12), 2039-2045 and [2] Ouyang, J., Cormier, D., Williams, S. A., & Borkholder, D. A. (2016). Photonic Sintering of Aerosol Jet Printed Lead Zirconate Titanate (PZT) Thick Films. *Journal of the American Ceramic Society*, 99(8), 2569-2577, which are herein incorporated by reference in their entirety.

Although various embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed is:

1. A process for sintering, annealing or crystalizing a target film, comprising:
 sintering, annealing or crystalizing the target film while the target film is disposed on a substrate by simultaneously (a) inducing temperature cycling throughout the thickness of the target film by applying a pulsed photonic energy comprising discrete pulses of 1.3 milliseconds or less duration to the target film and (b) reorienting dipoles in the target film by applying at least one of an electric field and a magnetic field to the target film, wherein the pulsed photonic energy is sufficient to increase the temperature of the target film above the Curie temperature of the material within the target film followed by cooling of the temperature of the target film to a temperature below the Curie temperature of the material within the target film between pulses of the pulsed photonic energy.

2. The process of claim 1, wherein the electric field is applied to the target film and the target film comprises a ferroelectric material.

3. The process of claim 2, wherein the dipoles are electric dipoles.

4. The process of claim 3, wherein the sintered, annealed or crystalized target film has piezoelectric properties.

5. The process of claim 1, wherein the magnetic field is applied to the target film and the target film comprises a magnetic material.

6. The process of claim 5, wherein the dipoles are magnetic dipoles.

7. The process of claim 6, wherein the sintered, annealed or crystalized target film has magnetic properties.

8. The process of claim 1, wherein the pulsed photonic energy is sourced from a photonic flash lamp, laser illumination, radiation, or UV illumination.

9. The process of claim 1, wherein the substrate is a low melting point substrate relative to a melting point of the target film.

10. The process of claim 1, wherein the pulsed photonic energy has a pulse profile characterized by pulse power, pulse duration, time between pulses, and total number of pulses.

11. The process of claim 10, wherein the pulse duration is in a range of from 0.13 milliseconds to 1.3 milliseconds.

12. The process of claim 10, wherein the pulsed photonic energy comprises from 15 pulses to 46 pulses.

13. The process of claim 1, wherein the target film has a thickness of 5 µm or less.

* * * * *